United States Patent
Kim et al.

(10) Patent No.: US 11,895,894 B2
(45) Date of Patent: Feb. 6, 2024

(54) DISPLAY APPARATUS INCLUDING THE BEZEL LAYER

(71) Applicant: Samsung Display Co., Ltd., Yongin-Si (KR)

(72) Inventors: Jeongki Kim, Hwaseong-si (KR); Jang-Il Kim, Asan-si (KR); Jeaheon Ahn, Hwaseong-si (KR); YeoGeon Yoon, Suwon-si (KR); Seok-Joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 191 days.

(21) Appl. No.: 17/369,184

(22) Filed: Jul. 7, 2021

(65) Prior Publication Data
US 2021/0343795 A1 Nov. 4, 2021

Related U.S. Application Data

(62) Division of application No. 16/722,803, filed on Dec. 20, 2019, now Pat. No. 11,081,533.

(30) Foreign Application Priority Data

Feb. 14, 2019 (KR) .................. 10-2019-0016989

(51) Int. Cl.
| H10K 59/38 | (2023.01) |
| H10K 50/856 | (2023.01) |
| H10K 59/30 | (2023.01) |
| H10K 59/126 | (2023.01) |
| H10K 59/127 | (2023.01) |
| H10K 59/121 | (2023.01) |
| H10K 71/00 | (2023.01) |

(52) U.S. Cl.
CPC ........... *H10K 59/38* (2023.02); *H10K 50/856* (2023.02); *H10K 59/126* (2023.02);
(Continued)

(58) Field of Classification Search
CPC .............. H01L 27/3206; H01L 27/322; H01L 27/3251; H01L 27/3262; H01L 27/3272;
(Continued)

(56) References Cited

U.S. PATENT DOCUMENTS

| 9,431,463 B2 | 8/2016 | Choi |
| 9,921,426 B2 | 3/2018 | Ji et al. |

(Continued)

FOREIGN PATENT DOCUMENTS

| KR | 1020150125207 A | 11/2015 |
| KR | 1020150129551 A | 11/2015 |

(Continued)

*Primary Examiner* — Matthew E Warren
(74) *Attorney, Agent, or Firm* — CANTOR COLBURN LLP

(57) ABSTRACT

A display apparatus includes a display panel including a plurality of pixels, and a cover panel including a window layer, an optical filter layer, a color filter layer and a bezel layer. The window layer includes a transmission region and a bezel region adjacent to the transmission region. The optical filter layer is disposed on the transmission region of the rear surface of the window layer. The color filter layer is disposed on the optical filter layer and includes a quantum dot. The bezel layer is disposed on the bezel region of the rear surface. The optical filter layer includes a partition wall layer, in which an opening is defined, a light-blocking layer disposed on the partition wall layer, and a reflection layer disposed in the opening. The bezel layer has a same color as the light-blocking layer.

5 Claims, 12 Drawing Sheets

(52) U.S. Cl.
CPC ....... *H10K 59/127* (2023.02); *H10K 59/1213* (2023.02); *H10K 59/30* (2023.02); *H10K 71/00* (2023.02)

(58) Field of Classification Search
CPC ............ H01L 51/5271; H01L 2251/56; H10K 50/856; H10K 59/30; H10K 59/38; H10K 59/1213; H10K 59/126; H10K 59/127; H10K 71/00
See application file for complete search history.

(56) References Cited

U.S. PATENT DOCUMENTS

| | | |
|---|---|---|
| 2017/0324058 A1 | 11/2017 | Min |
| 2018/0138214 A1 | 5/2018 | Lee et al. |
| 2019/0049764 A1 | 2/2019 | Chen |
| 2019/0317621 A1 | 10/2019 | Lee et al. |
| 2019/0382617 A1 | 12/2019 | Kim et al. |
| 2020/0105853 A1 | 4/2020 | Kwon |
| 2020/0111856 A1* | 4/2020 | Lee .......................... H10K 59/40 |
| 2020/0159063 A1 | 5/2020 | Heo |
| 2020/0168667 A1* | 5/2020 | Kim .......................... H10K 71/00 |
| 2020/0192140 A1 | 6/2020 | Lee |
| 2020/0212109 A1* | 7/2020 | Lee .................... G02F 1/133514 |
| 2020/0219938 A1* | 7/2020 | Ahn ...................... H10K 50/865 |

FOREIGN PATENT DOCUMENTS

| | | | | |
|---|---|---|---|---|
| KR | 1020160009669 A | | 1/2016 | |
| KR | 20200039859 A | * | 4/2020 | ........... H01L 27/322 |
| TW | 201037647 A | * | 10/2010 | ........... G06F 3/0412 |

\* cited by examiner

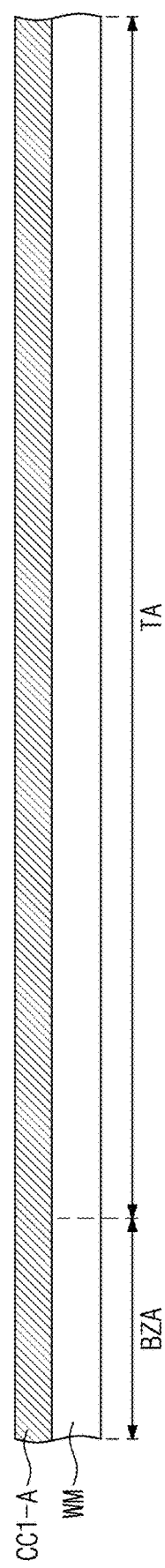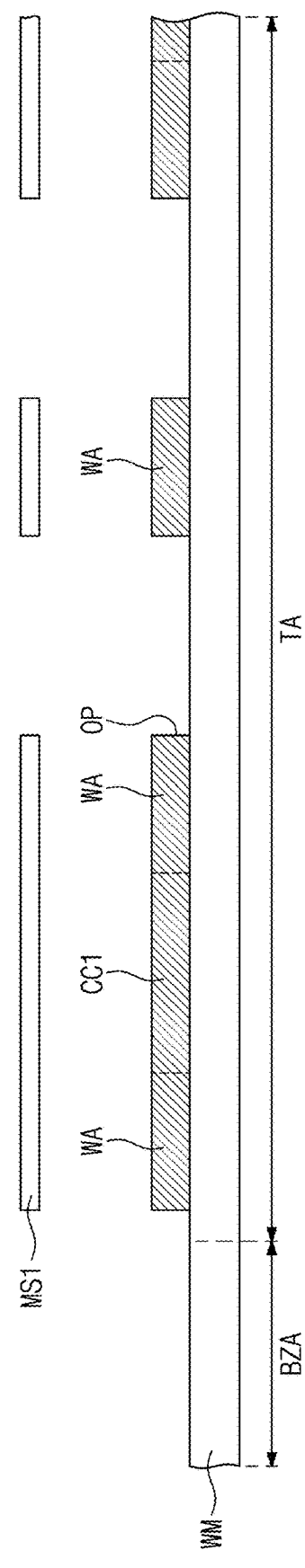

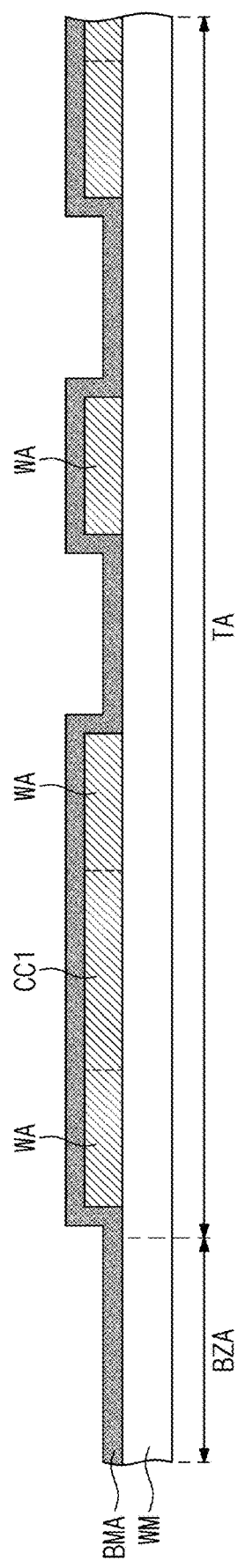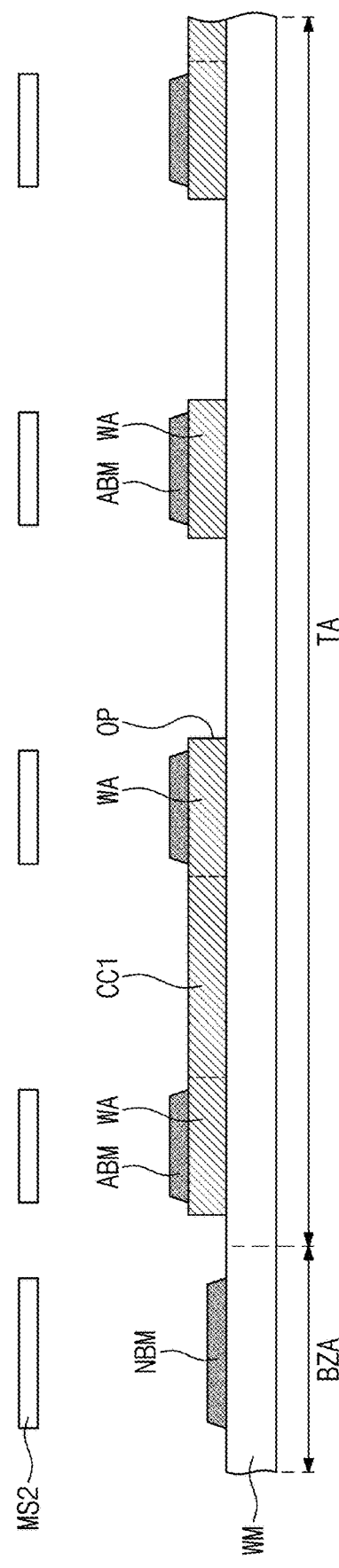

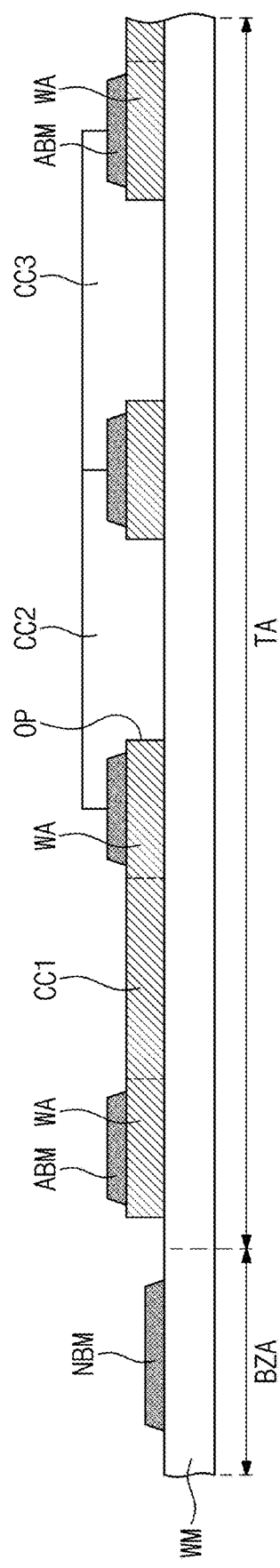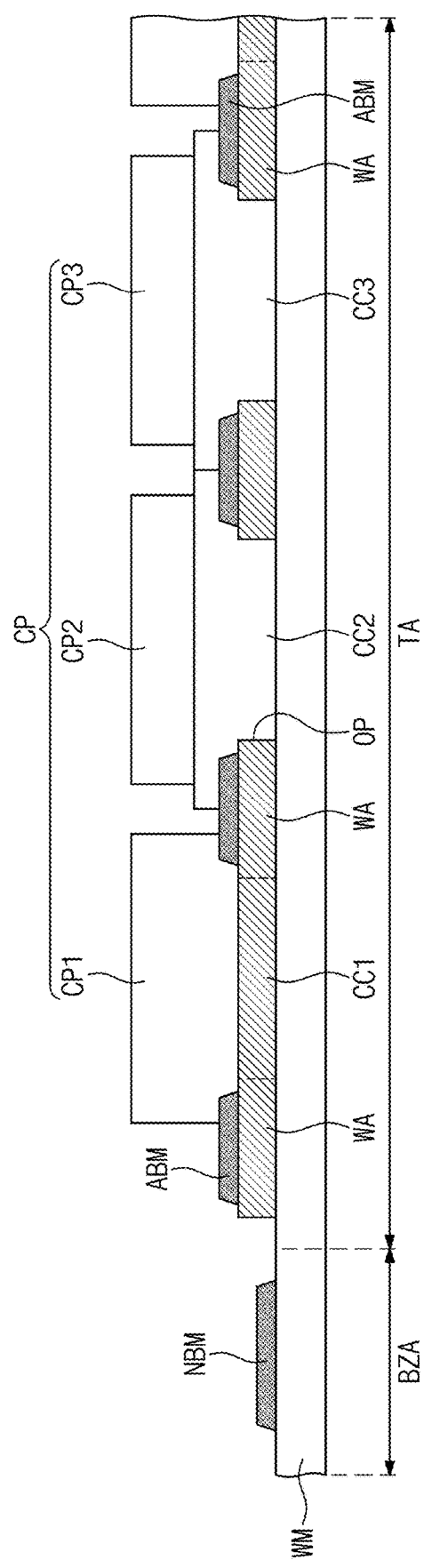

DISPLAY APPARATUS INCLUDING THE BEZEL LAYER

This application is a divisional of U.S. patent application Ser. No. 16/722,803, filed on Dec. 20, 2019, which claims priority to Korean Patent Application No. 10-2019-0016989, filed on Feb. 14, 2019, and all the benefits accruing therefrom under 35 U.S.C. § 119, the content of which in its entirety is herein incorporated by reference.

BACKGROUND

1. Field

The disclosure relates to a display apparatus and a method of fabricating the display apparatus, and in particular, to a display apparatus with improved reliability and a method of fabricating the display apparatus.

2. Description of the Related Art

A display apparatus is typically activated by electrical signals applied thereto. The display apparatus may include a display panel for displaying an image. An organic light emitting display panel, which is one type of display panel, has desired properties, such as low power consumption, high brightness, and high response speed.

The organic light emitting display panel may be fabricated by forming red, green, and blue organic light emitting layers, which are configured to emit respective lights, on red, green, and blue pixel regions, respectively. Alternatively, the organic light emitting display panel may be fabricated by forming an organic light emitting layer, which is configured to emit a white light, and then forming red, green, and blue color filters on the red, green, and blue pixel regions.

The display apparatus may include an active region, on which an image is displayed, and a bezel region, which is adjacent to the active region.

SUMMARY

An embodiment of the invention provides a display apparatus configured to suppress a light leakage at a bezel region, and a method of fabricating the display apparatus.

According to an embodiment of the invention, a display apparatus may include a display panel and a cover panel. In such an embodiment, the display panel includes a base substrate and a plurality of pixels, where the base substrate includes an active region and a peripheral region adjacent to the active region, and the plurality of pixels is disposed on the base substrate to generate light and overlaps the active region. In such an embodiment, the cover panel includes a window layer, an optical filter layer, a color filter layer, and a bezel layer, where the window layer includes a transmission region overlapping the active region and a bezel region adjacent to the transmission region and includes a rear surface facing the display panel and a front surface opposite to the rear surface, the optical filter layer is disposed on the transmission region of the rear surface, the color filter layer is disposed on the optical filter layer and includes a quantum dot, and the bezel layer is disposed on the bezel region of the rear surface. In such an embodiment, the optical filter layer includes a partition wall layer, in which an opening is defined, a light-blocking layer disposed on the partition wall layer, and a reflection layer disposed in the opening. In such an embodiment, the bezel layer has a same color as the light-blocking layer.

In an embodiment, the bezel layer may include a same material as the light-blocking layer.

In an embodiment, the bezel layer may have a same thickness as the light-blocking layer.

In an embodiment, the opening may be provided in plural. In such an embodiment, the reflection layer may include first to third reflection patterns having different colors from each other, and the first to third reflection patterns may be disposed in corresponding ones of the openings, respectively.

In an embodiment, one of the first to third reflection patterns may include a same material as the partition wall layer.

In an embodiment, at least one of the first to third reflection patterns may cover a portion of the partition wall layer and a portion of the light-blocking layer.

In an embodiment, the color filter layer may include first to third color patterns, which overlap the first to third reflection patterns, respectively. In such an embodiment, one of the first to the third color patterns may transmit the light provided from the pixels.

In an embodiment, the light provided from the pixels may be a blue light.

In an embodiment, the bezel layer may include a bottom portion facing the rear surface, an upper portion opposite to the bottom portion, and a side portion connecting the lower and upper portions to each other, and the side portion may be inclined at an oblique angle relative to the bottom portion.

In an embodiment, the bezel layer may have a closed loop shape surrounding the transmission region.

In an embodiment, each of the plurality of pixels may include a transistor and an organic light emitting device connected to the transistor. In such an embodiment, the organic light emitting device may include a first electrode connected to the transistor, a second electrode opposite to the first electrode, and a light emitting layer disposed between the first electrode and the second electrode.

In an embodiment, each of the plurality of pixels may include a transistor and a liquid crystal display device connected to the transistor. In such an embodiment, the liquid crystal display device may include a first electrode connected to the transistor, a second electrode opposite to the first electrode, and a liquid crystal layer disposed between the first electrode and the second electrode.

According to an embodiment of the invention, a display apparatus includes a window layer, in which a transmission region and a bezel region adjacent to the transmission region are defined, a partition wall layer disposed on the transmission region of the window layer, where a plurality of openings is defined through the partition wall layer, a light-blocking layer disposed on the partition wall layer, a reflection layer including first to third reflection patterns disposed in corresponding ones of the openings, a color filter layer disposed on the reflection layer, where the color filter layer includes a quantum dot, and a bezel layer disposed on the bezel region. In such an embodiment, the bezel layer includes a same material as the light-blocking layer.

In an embodiment, the bezel layer may have a same color as the light-blocking layer.

In an embodiment, the bezel layer may have a closed loop shape surrounding the transmission region.

In an embodiment, one of the first to third reflection patterns may include a same material as the partition wall layer.

In an embodiment, the color filter layer may include first to third color patterns overlapping the first to third reflection patterns, respectively, and one of the first to the third color patterns may transmit light provided from the pixels.

According to an embodiment of the invention, a method of fabricating a display apparatus may include forming a partition wall layer, in which a plurality of openings are defined, on a transmission region of a window layer, where the window layer is divided into a bezel region adjacent to the transmission region, providing a light-blocking layer, patterning a first material, which is formed on the partition wall layer, forming a bezel layer by forming and patterning a second material on the bezel region of the window layer, forming reflection patterns, which have different colors from each other, in corresponding ones of the openings, forming an optical filter layer, which includes a quantum dot, on the reflection patterns, and forming a cover inorganic layer on the window layer. In such an embodiment, the light-blocking layer and the bezel layer are simultaneously patterned.

In an embodiment, the first material may be a same material as the second material.

In an embodiment, one of the reflection patterns may be formed by a same process as a process for the partition wall layer.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

FIGS. 9A to 9G are sectional views illustrating a method of fabricating a display apparatus, according to an embodiment of the invention.

DETAILED DESCRIPTION

Figure 1:
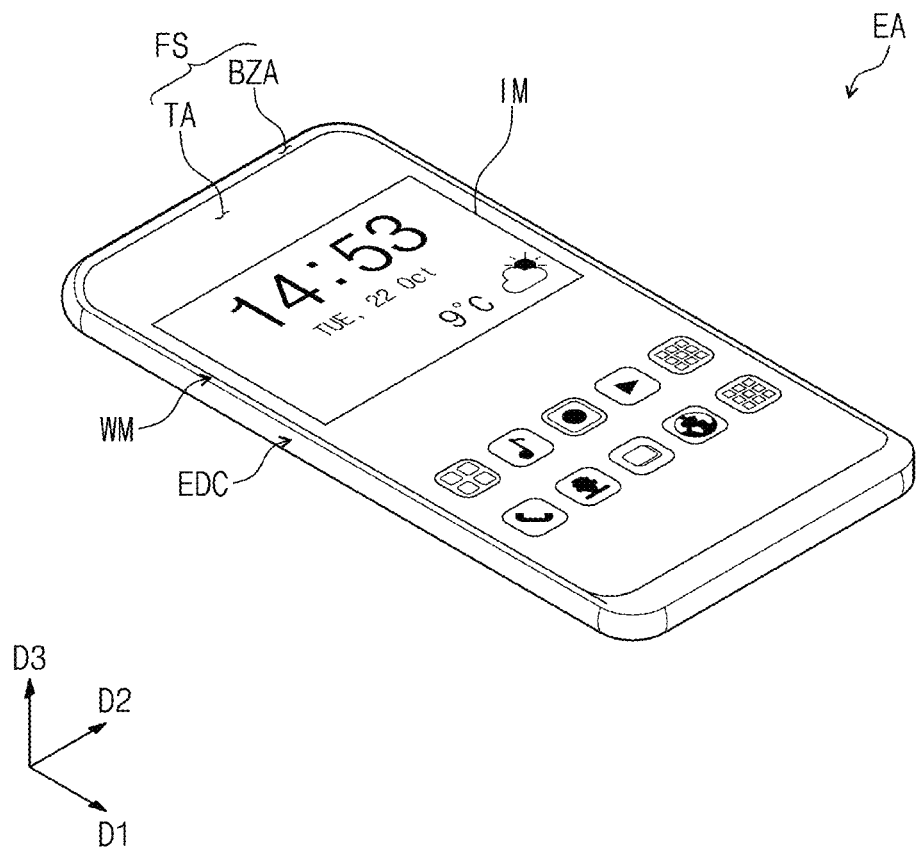
FIG. 1 is a perspective view of a display apparatus according to an embodiment of the invention.

The invention will now be described more fully with reference to the accompanying drawings, in which exemplary embodiments are shown. This invention may, however, be embodied in many different forms and should not be construed as being limited to the embodiments set forth herein. Rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. "Or" means "and/or." "At least one of A and B" means "A and/or B." As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments of the inventions are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventions should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the invention will be described in detail with reference to the accompanying drawings.

Figure 2:
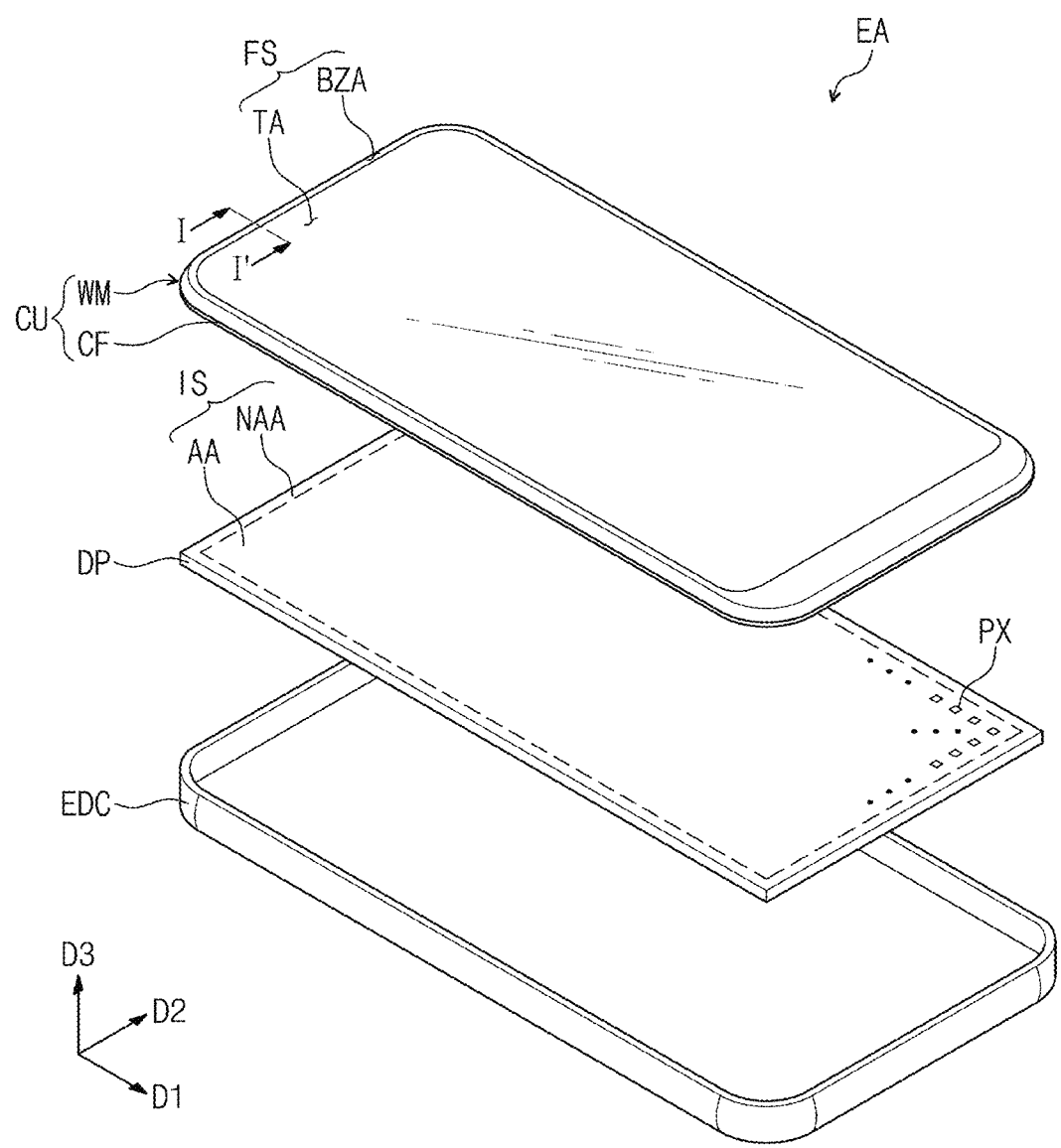
FIG. 2 is an exploded perspective view of a display apparatus according to an embodiment of the invention.
Figure 3:
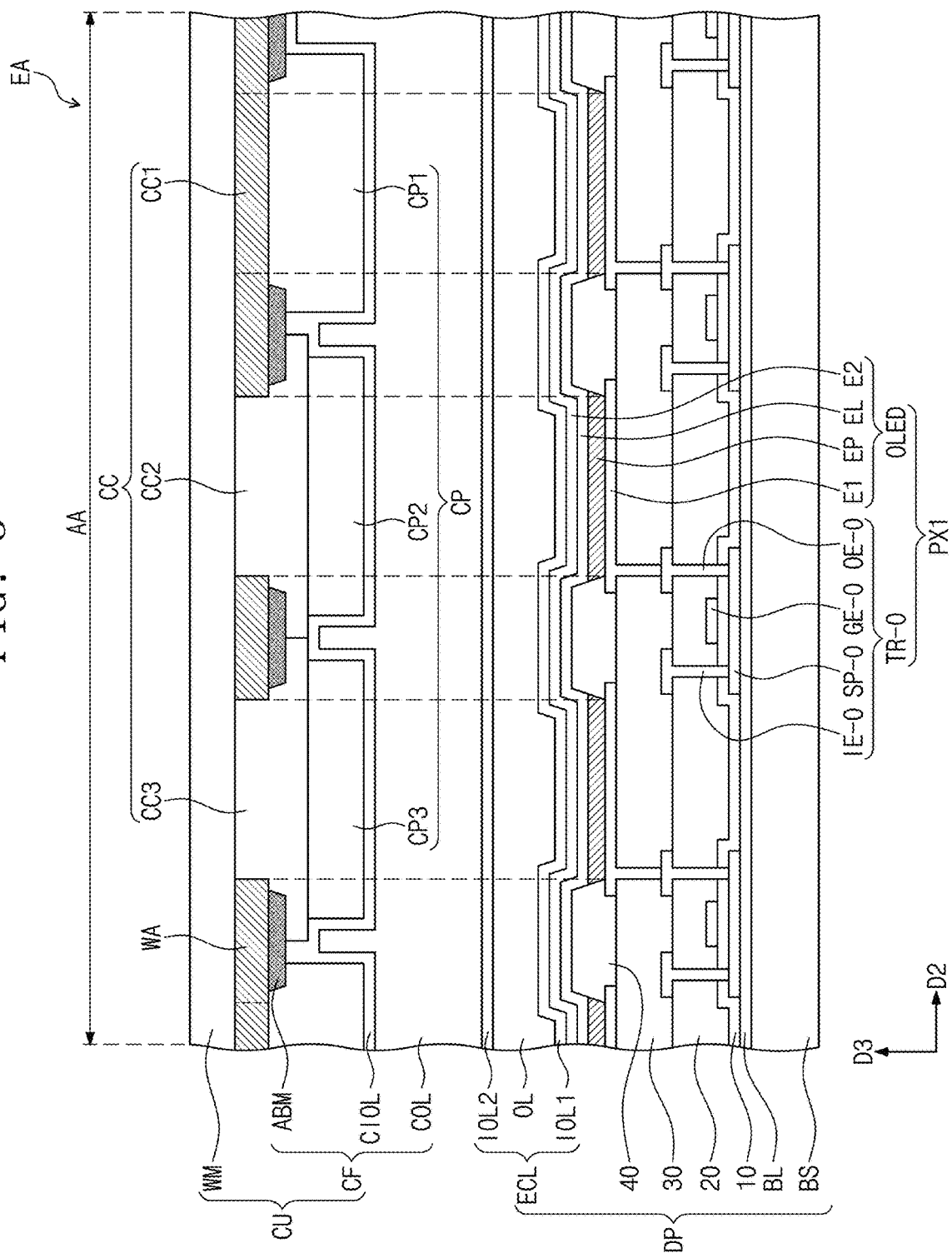
FIG. 3 is a sectional view illustrating a display apparatus according to an embodiment of the invention.
Figure 4:
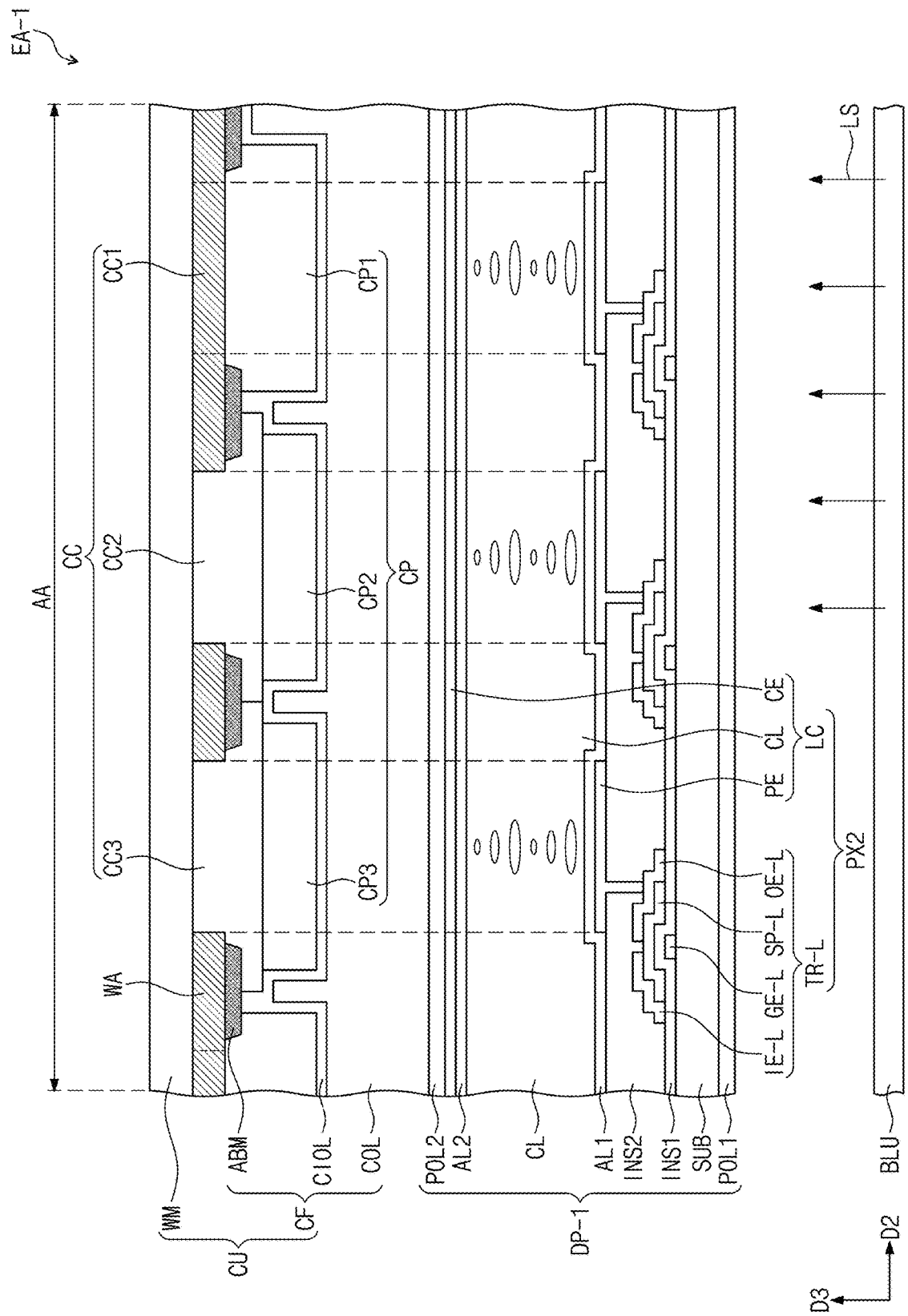
FIG. 4 is a sectional view illustrating a display apparatus according to an alternative embodiment of the invention.
Figure 5:
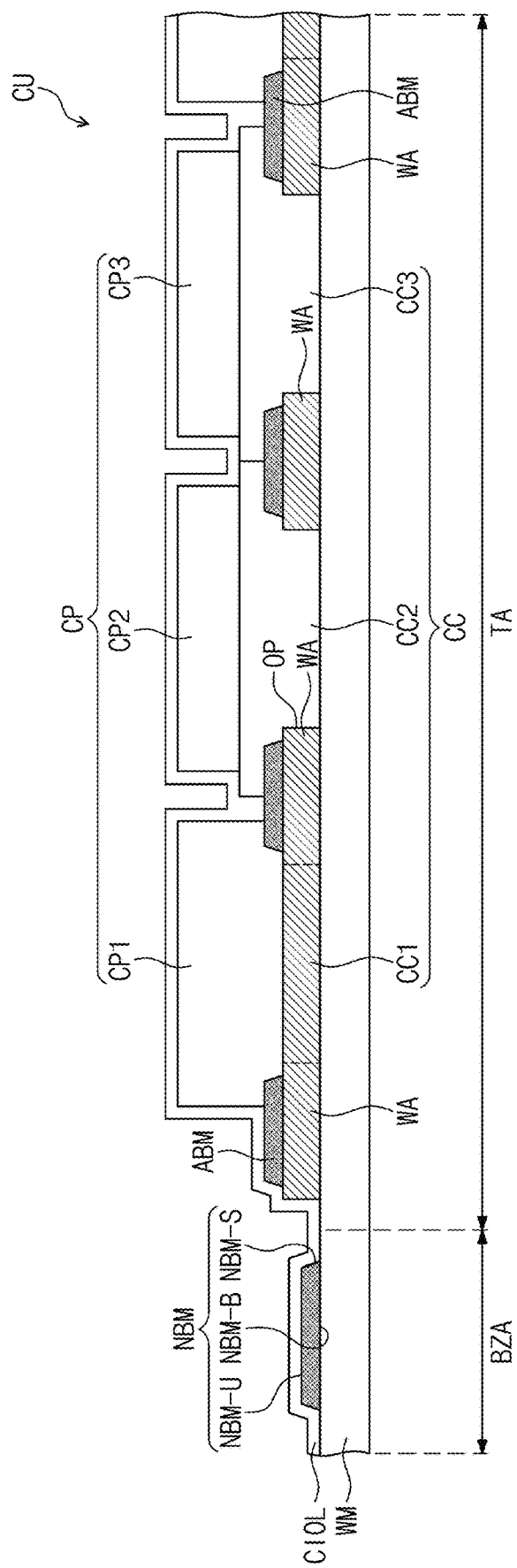
FIG. 5 is a sectional view illustrating a cover panel according to an embodiment of the invention.

FIG. 1 is a perspective view of a display apparatus according to an embodiment of the invention. FIG. 2 is an exploded perspective view of a display apparatus according to an embodiment of the invention. FIG. 3 is a sectional view illustrating a display apparatus according to an embodiment of the invention. FIG. 4 is a sectional view illustrating a display apparatus according to an embodiment of the invention. FIG. 5 is a sectional view illustrating a cover panel according to an embodiment of the invention. An embodiment of a display apparatus according to the invention will be described in detail with reference to FIGS. 1 to 5.

Referring to FIGS. 1 and 2, an embodiment of a display apparatus EA may display an image IM in a third direction D3 that is not parallel (or normal) to a plane defined by a first direction D1 and a second direction D2. The third direction D3 may be a thickness direction of the display apparatus EA. The display apparatus EA may include a cover panel CU, a display panel DP, and a cover case EDC.

In an embodiment, as shown in FIG. 2, the cover panel CU may include a window layer WM and an optical layer CF. The cover panel CU may be disposed on the display panel DP to cover a front surface IS of the display panel DP. The window layer WM may include a front surface FS exposed to an outside. The image IM displayed on the display panel DP may be seen by a user through the front surface FS.

The window layer WM may have a single- or multi-layered structure. In one embodiment, for example, the window layer WM may have a stacking structure including a plurality of plastic films, which are coupled to each other by an adhesive layer, or may have a stacking structure including a glass substrate and a plastic film, which are coupled to each other by an adhesive layer. The window layer WM may be optically transparent. In one embodiment, for example, the window layer WM may include a glass or a plastic.

The front surface FS of the window layer WM may include a transmission region TA and a bezel region BZA, when viewed from a plan view in the third direction D3. The transmission region TA may be a region that transmits light, which is provided from the display panel DP. The transmission region TA may have a shape corresponding to an active region AA of the display panel DP. In one embodiment, for example, the transmission region TA may overlap the entire or partial region of a front surface of the active region AA. Thus, the image IM, which is displayed on the active region AA of a display module DD, may be provided to a user through the transmission region TA.

The bezel region BZA may be a region having a lower optical transmittance than the transmission region TA. The bezel region BZA may define a shape of the transmission region TA. The bezel region BZA may be adjacent to the transmission region TA and may have a closed loop shape enclosing the transmission region TA.

The bezel region BZA may have a predetermined color. The bezel region BZA may cover a peripheral region NAA of the display panel DP and may prevent the peripheral region NAA from being recognized by a user. In one embodiment, for example, when light generated from the display panel DP is leaked to the peripheral region NAA, the bezel region BZA may block the leaked light, and thus, the peripheral region NAA may be prevented from being recognized by a user.

The display panel DP may display the image IM through the front surface IS. The front surface IS may include the active region AA and the peripheral region NAA. The image IM may be displayed on the active region AA. The peripheral region NAA may be adjacent to the active region AA.

The display panel DP may include a plurality of pixels PX. The pixels PX may display an image or emit lights in response to electrical signals. Each of the pixel PX may generate light, and such lights emitted from the pixels PX may form the image IM to be displayed on the active region AA. In an embodiment, the pixels PX may include one of a pixel PX1 including an organic light emitting device OLED and a pixel PX2 including a liquid crystal display device LC.

The cover case EDC may be combined with the cover panel CU. The cover case EDC may have a surface, which is used as a rear surface of the display apparatus EA. The cover case EDC may be combined with the cover panel CU to define an internal space. Elements of the display panel DP may be disposed or contained in the internal space. The cover case EDC may include a material with a specific (e.g., relatively high) stiffness. In one embodiment, for example, the cover case EDC may include a plurality of frames and/or plates, each of which includes or is formed of at least one of a glass, a plastic, or a metallic material. The cover case EDC may stably protect elements constituting the display apparatus EA, which are contained in the internal space, from an external impact.

Referring to FIG. 3, the display apparatus EA may include the display panel DP and the cover panel CU. The display panel DP may include a base layer BS, insulating layers BL, 10, 20, 30, and 40, an encapsulation layer ECL, and a pixel PX1.

The base layer BS may function as a ground layer, on which elements of the display panel DP are disposed. The base layer BS may include an insulating material. In one embodiment, for example, the base layer BS may include a glass, a resin film, or a stack of alternately-stacked organic and inorganic layers.

Each of the pixel PX1 may generate light, and such lights emitted from the pixels PX1 may form the image IM to be displayed on the active region AA. In an embodiment, a plurality of the pixels PX1 may be provided. Each of the pixels may be connected to a plurality of signal lines (not shown). In one embodiment, for example, signal lines, such as a gate line or a data line, may be connected to each pixel PX1.

An auxiliary layer BL may include an inorganic material. The auxiliary layer BL may include a barrier layer and/or a buffer layer. In one embodiment, for example, the auxiliary layer BL may effectively prevent oxygen or moisture from entering the pixel PX1 through the base layer BS or may have a surface energy, which is lower than a surface energy of the base layer BS, thereby allowing the pixel PX1 to be stably formed thereon.

At least one of the base layer BS and the auxiliary layer BL may include a plurality of layers, which are alternately stacked one on another. In an embodiment, at least one of the barrier and buffer layers of the auxiliary layer BL may include a plurality of layers or may be omitted. However, the structure of the display panel DP is not limited thereto, and in an alternative embodiment, the structure of the display panel DP may be variously modified or changed and is not limited to a specific structure.

The pixel PX1 may include a first transistor TR-O and the organic light emitting device OLED. The first transistor TR-O may include a semiconductor pattern SP-O, a control electrode GE-O, an input electrode IE-O, and an output electrode OE-O.

The semiconductor pattern SP-O may be disposed on the auxiliary layer BL. The semiconductor pattern SP-O may include a semiconductor material. The control electrode GE-O may be spaced apart from the semiconductor pattern SP-O in the third direction D3 with a first insulating layer 10 interposed therebetween. The control electrode GE-O may include a conductive material. In one embodiment, for example, the control electrode GE-O may include at least one of metallic materials (e.g., nickel (Ni), molybdenum (Mo), aluminum (Al), titanium (Ti), copper (Cu), and tungsten (W)) or metal oxide materials.

The input electrode IE-O and the output electrode OE-O may be spaced apart from the control electrode GE-O in the second direction D2 with a second insulating layer 20 interposed therebetween. The input electrode IE-O and the output electrode OE-O may be disposed through the first insulating layer 10 and the second insulating layer 20 and may be respectively coupled to two different portions of the semiconductor pattern SP-O.

Each of the input electrode IE-O and the output electrode OE-O may include a conductive material. In one embodiment, for example, each of the input electrode IE-O and the output electrode OE-O may be formed of or include at least one of nickel (Ni), chromium (Cr), molybdenum (Mo), aluminum (Al), titanium (Ti), copper (Cu), tungsten (W), or alloys thereof. Each of the input electrode IE-O and the output electrode OE-O may have a single- or multi-layered structure.

A third insulating layer 30 may be disposed on the second insulating layer 20 to cover the input electrode IE-O and the output electrode OE-O. In an embodiment, the semiconductor pattern SP-O may be disposed on the control electrode GE-O. In an alternative embodiment, the semiconductor pattern SP-O may be disposed on the input electrode IE-O and the output electrode OE-O. In another alternative embodiment, the input electrode IE-O and the output electrode OE-O may be disposed in a same layer as a layer under the semiconductor pattern SP-O and may be directly coupled to the semiconductor pattern SP-O. According to embodiments of the invention, the structure of the first transistor TR-O may be variously modified or changed, and not limited to a specific structure of the first transistor TR-O.

The organic light emitting device OLED may be disposed on the third insulating layer 30. The organic light emitting device OLED may include at least one of various light-emitting devices. In one embodiment, for example, the organic light emitting device OLED may include an organic light emitting device, an electrophoretic device, an electrowetting device or a liquid crystal capacitor. Hereinafter, for convenience of description, embodiments where the organic light emitting device OLED is an organic light emitting device will be described in detail. The organic light emitting device OLED may include a first electrode E1, a light-emitting pattern EP, a control layer EL, and a second electrode E2.

The first electrode E1 may be disposed through the third insulating layer 30 and may be coupled to the first transistor TR-O. In an embodiment, although not shown, the display panel DP may further include an additional connection electrode, which is disposed between the first electrode E1 and the first transistor TR-O, and in such an embodiment, the first electrode E1 may be electrically coupled to the first transistor TR-O through the additional connection electrode.

A fourth insulating layer 40 may be disposed on the third insulating layer 30. The fourth insulating layer 40 may be formed of or include an organic material and/or an inorganic material and may have a single-layered structure or a stacked structure of a plurality of layers. An opening may be defined in the fourth insulating layer 40. The opening may expose at least a portion of the first electrode E1. The fourth insulating layer 40 may be a pixel definition layer.

The light-emitting pattern EP may be disposed in the opening defined in the fourth insulating layer 40. The light-emitting pattern EP may be disposed on the first electrode E1 exposed by the opening. The light-emitting pattern EP may include a light-emitting material. In one embodiment, for example, the light-emitting pattern EP may include at least one of materials capable of emitting red, green, and blue lights and may include a fluorescent or phosphorescent material. The light-emitting pattern EP may include an organic light emitting material or an inorganic light-emitting material. The light-emitting pattern EP may emit a light in response to a potential difference between the first electrode E1 and the second electrode E2.

According to an embodiment of the invention, the light-emitting pattern EP may include a quantum dot material. The quantum dot may be nanocrystal including at least one material selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle. In an embodiment, each of the quantum dots may have a core/shell structure, in which one quantum dot is enclosed by another quantum dot. At an interface between the core and the shell, an element contained in the shell may have a concentration gradient decreasing in a central direction.

In an embodiment, the quantum dot may have a core-shell structure, which includes a core containing the afore-described nanocrystal and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. In one embodiment, for example, the shell of the quantum dot may be formed of or include oxide compounds of metallic or nonmetallic elements, semiconductor compounds, or any combination thereof.

In one embodiment, for example, the oxide compounds of metallic or nonmetallic elements of the shell may include binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO) and ternary compounds (e.g., $MgAl_2O_4$, $CoFe_2O_4$, $NiFe_2O_4$, and $CoMn_2O_4$), but the invention is not limited thereto.

In an embodiment, the semiconductor compounds of the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the invention is not limited thereto.

In an embodiment, each of the quantum dots may have a light-emitting wavelength spectrum whose full width half maximum ("FWHM") is less than about 45 nanometers (nm) (e.g., less than about 40 nm or less than about 30 nm), and in this case, improved color purity or color reproduction characteristics may be realized. In such an embodiment, the quantum dots may allow light to be emitted radially, and thus, a viewing angle property may be improved.

In an embodiment, the quantum dots may be a spherical, pyramid-shaped, multi-arm, or cubic nano particle. In an alternative embodiment, the quantum dots may be a nano tube, a nano wire, a nano fiber, a nano plate-shaped particle, but the invention is not limited thereto.

A wavelength or color of light emitted from the quantum dot may be determined by a particle size of the quantum dot, and by providing quantum dots of various sizes, it may be possible to realize various colors (e.g., blue, red, and green).

The control layer EL may be disposed between the first electrode E1 and the second electrode E2. The control layer EL may be disposed adjacent to the light-emitting pattern EP. The control layer EL may control the movement of electric charges to improve light-emitting efficiency and life span of the organic light emitting device OLED. The control layer EL may include at least one of a hole transport material, a hole injection material, an electron transport material, or an electron injection material.

In an embodiment, the control layer EL is disposed between the light-emitting pattern EP and the second electrode E2 as shown in FIG. 3. However, the invention is not limited thereto, and in an alternative embodiment, the control layer EL may be disposed between the light-emitting pattern EP and the first electrode E1 or may include a plurality of layers, which are stacked in the third direction D3 with the light-emitting pattern EP interposed therebetween. In another alternative embodiment of the organic light emitting device OLED, the control layer EL may be omitted.

The control layer EL may be integrally formed as a single unitary body or unit, which extends from the active region AA to the peripheral region NAA. The control layer EL may be provided in common for a plurality of pixels.

The second electrode E2 may be disposed on the control layer EL. The second electrode E2 may be disposed to face the first electrode E1. The second electrode E2 may be integrally formed as a single unitary body or unit, which extends from the active region AA to the peripheral region NAA. The second electrode E2 may be provided in common for the plurality of pixels PX. The organic light emitting device OLED, which is disposed in each of the pixels PX, may receive a common power voltage (hereinafter, a second power voltage) through the second electrode E2.

The second electrode E2 may be formed of or include a transparent conductive material or a transflective conductive material. Thus, light generated by the light-emitting pattern EP may pass through the second electrode E2 and may propagate in the third direction D3. However, the invention is not limited thereto, and in an alternative embodiment, the organic light emitting device OLED may have a back-side emission structure, in which the first electrode E1 includes a transparent or transflective material, or a double-side emission structure, in which light is emitted through top and bottom surfaces thereof.

The encapsulation layer ECL may be disposed on the organic light emitting device OLED to seal or encapsulate the organic light emitting device OLED. The encapsulation layer ECL may be provided in common for the plurality of pixels PX. Although not shown, a capping layer covering the second electrode E2 may be further disposed between the second electrode E2 and the encapsulation layer ECL.

The encapsulation layer ECL may include a first inorganic layer IOL1, an organic layer OL, and a second inorganic layer IOL2, which are sequentially stacked one on another in the third direction D3. However, the invention is not limited thereto, and in an alternative embodiment, an encapsulation layer EP-E may further include at least one of inorganic or organic layers.

The first inorganic layer IOL1 may cover the second electrode E2. The first inorganic layer IOL1 may effectively prevent external moisture or oxygen from entering the organic light emitting device OLED. In one embodiment, for example, the first inorganic layer IOL1 may be formed of or include at least one of silicon nitride, silicon oxide, or compounds thereof. The first inorganic layer IOL1 may be provided or formed by a deposition process.

The organic layer OL may be disposed on the first inorganic layer IOL1 to be in contact with the first inorganic layer IOL1. The organic layer OL may be disposed on the first inorganic layer IOL1 to have a flat top surface. In one embodiment, for example, the organic layer OL may cover the first inorganic layer IOL1 having an uneven top surface or particles on the first inorganic layer IOL1 to prevent the uneven surface profile of the first inorganic layer IOL1 or the particles from affecting elements or layers to be formed on the organic layer OL.

In an embodiment, the organic layer OL may relieve stress between layers that are in contact with each other. The organic layer OL may include an organic material and may be formed by a solution process, such as spin-coating, slit-coating, and inkjet processes.

The second inorganic layer IOL2 may be disposed on the organic layer OL to cover the organic layer OL. In such an embodiment, the organic layer OL having a relatively flat top surface to allow the second inorganic layer IOL2 to be more stably formed thereon, compared to a case where the second inorganic layer IOL2 is formed on the first inorganic layer IOL1. The second inorganic layer IOL2 may encapsulate the organic layer OL and effectively prevent moisture in the organic layer OL from being leaked to the outside. The second inorganic layer IOL2 may include at least one of silicon nitride, silicon oxide, or compounds thereof. The second inorganic layer IOL2 may be formed by a deposition process.

In an embodiment, the cover panel CU may be disposed on the encapsulation layer ECL. The cover panel CU may include a planarization layer COL disposed on the second inorganic layer IOL2.

The planarization layer COL may cover an uneven front surface of the encapsulation layer ECL and may provide a flat surface to the active region AA. However, the invention is not limited thereto, and in an alternative embodiment, the cover panel CU may include a plurality of planarization layers COL or may not have any planarization layer.

Referring to FIG. 4, an alternative embodiment of a display apparatus EA-1 may include a backlight unit BLU, a display panel DP-1, and the cover panel CU. The display panel DP-1 may include a base layer SUB, insulating layers INS1 and INS2, polarizers POL1 and POL2, alignment layers AL1 and AL2 and the pixel PX2.

The backlight unit BLU may provide light to the display panel DP-1. Light LS emitted from the backlight unit BLU may have a specific wavelength range. In one embodiment, for example, the light LS may be an ultraviolet light ("UV") or a blue light. In an embodiment where the light LS is emitted from a side surface of the backlight unit BLU, a light guide plate (not shown) may be further disposed to guide the light LS to a side surface of the base layer SUB.

The base layer SUB may function as a ground layer, on which elements of the display panel DP-1 are disposed. The base layer SUB may include an insulating material. In one embodiment, for example, the base layer SUB may include glass, a resin film, or a stack of alternately-stacked organic and inorganic layers.

Each of the pixel PX2 may generate light, and such lights emitted from the pixels PX2 may form the image IM to be displayed on the active region AA. A plurality of the pixels PX2 may be provided. Each of the pixels PX2 may be connected to a plurality of signal lines (not shown). In one embodiment, for example, signal lines, such as gate and data lines, may be connected to each of the pixels PX2.

The pixel PX2 may include a second transistor TR-L and the liquid crystal display device LC. The second transistor TR-L may include a control electrode GE-L, a semiconductor pattern SP-L, an input electrode IE-L, and an output electrode OE-L. The control electrode GE-L may be disposed on the base layer SUB. The control electrode GE-L may include a conductive material. In one embodiment, for example, the control electrode GE-L may include at least one of metallic materials (e.g., nickel (Ni), molybdenum (Mo), aluminum (Al), titanium (Ti), copper (Cu), and tungsten (W)) or metal oxide materials.

A first insulating layer INS1 may be disposed on the base layer BS to cover the control electrode GE-L.

The semiconductor pattern SP-L may be disposed on the first insulating layer INS1. The semiconductor pattern SP-L may include a semiconductor material. At least a portion of the semiconductor pattern SP-L may overlap the control electrode GE-L.

The input electrode IE-L and the output electrode OE-L may be disposed on the first insulating layer INS1. The input electrode IE-L may include two portions, one of which is connected to the data line (not shown), and the other of which overlaps the semiconductor pattern SP-L. The output electrode OE-L may include two portions, one of which overlaps the semiconductor pattern SP-L, and the other of which is connected to a first electrode PE. The input electrode IE-L and the output electrode OE-L may be spaced apart from each other in the second direction D2.

Each of the input electrode IE-L and the output electrode OE-L may include a conductive material. In one embodiment, for example, each of the input electrode IE-L and the output electrode OE-L may be formed of or include at least one of nickel (Ni), chromium (Cr), molybdenum (Mo), aluminum (Al), titanium (Ti), copper (Cu), tungsten (W), or alloys thereof. Each of the input electrode IE-L and the output electrode OE-L may have a single- or multi-layered structure.

A second insulating layer INS2 may be disposed on the first insulating layer INS1. The second insulating layer INS2 may cover the second transistor TR-L. The second insulating layer INS2 may include an organic layer and/or an inorganic layer. The second insulating layer INS2 may have a single- or multi-layered structure. In one embodiment, for example, the second insulating layer INK may include an inorganic layer, which is disposed on the second transistor TR-L, and an organic layer, which is disposed on the inorganic layer to have a flat top surface.

The first or pixel electrode PE may be disposed on the second insulating layer INS2. The first electrode PE may be electrically connected to the output electrode OE-L through a contact hole, which is defined or formed through the second insulating layer INS2. The first electrode PE may include a transparent conductive material. In one embodiment, for example, the first electrode PE may include at least one of indium oxide, gallium oxide, titanium oxide, or zinc oxide.

The liquid crystal layer CL may include liquid crystal molecules that exhibit an anisotropic property or specific orientations. Orientations of the liquid crystal molecules may be controlled by an electric field, which is generated by a difference in voltage between a second electrode CE and the first electrode PE. An amount of light to pass through the liquid crystal layer CL may be adjusted by controlling the orientations of the liquid crystal molecules.

The second or common electrode CE may face the first electrode PE. The second electrode CE, along with the first electrode PE, may constitute or collectively define a liquid crystal capacitor. The second electrode CE may include a transparent conductive material. In one embodiment, for example, the second electrode CE may include at least one of indium tin oxide, indium zinc oxide, indium gallium zinc oxide, fluorine zinc oxide, gallium zinc oxide, or tin oxide.

In an alternative embodiment, although not shown, the second electrode CE may be disposed on the base layer SUB. In such an embodiment, the second electrode CE and the first electrode PE may be disposed in a same layer as or may be disposed in different layers from each other with insulating layers interposed therebetween.

In an embodiment, the display panel DP-1 may further include a first alignment layer AL1 and a second alignment layer AL2. The first alignment layer AL1 may be disposed between the first electrode PE and the liquid crystal layer CL, the second alignment layer AL2 may be disposed between the liquid crystal layer CL and the second electrode CE, and the first alignment layer AL1 and the second alignment layer AL2 may control orientations of the liquid crystal molecules of the liquid crystal layer CL. The first alignment layer AL1 and the second alignment layer AL2 may be a vertical alignment layer and may include polyamic acid, poly siloxane, poly imide, and so forth.

According to an embodiment of the invention, the display panel DP-1 may include at least one polarizer POL1 or POL2. In one embodiment, for example, the display panel DP-1 may include a first polarizer POL1 and a second polarizer POL2 disposed to change a polarization state of light incident from the backlight unit BLU. The first polarizer POL1 may be disposed to face the backlight unit BLU. The second polarizer POL2 may be disposed between the common electrode CE and the planarization layer COL. The polarizers may have a structure, which includes a plurality of patterns or a plurality of stacked inorganic layers, for changing a polarization state of an incident light. In one embodiment, for example, the polarizer may include a wire grid polarizer or a distributed Bragg reflector and a polarization film.

In an embodiment, the cover panel CU may be disposed on the second polarizer POL2. The cover panel CU may include the planarization layer COL disposed on the second polarizer POL2.

The planarization layer COL may cover the second polarizer POL2 and may provide a flat surface in the active region AA. However, the invention is not limited to thereto, and in an alternative embodiment, a cover panel CU-1 may include a plurality of planarization layers COL or may not have any planarization layer.

The cover panel CU, which is disposed on the display panel DP or DP-1, is separately illustrated in FIG. 5. In FIG. 5, the planarization layer COL of the cover panel CU is omitted. In an embodiment, the cover panel CU may be disposed on the display panel DP or DP-1. The cover panel CU may include the window layer WM and the optical layer CF.

In an embodiment, the optical layer CF may include a partition wall layer WA, a reflection layer CC, a light-blocking layer ABM, and a color filter layer CP, which are disposed on the transmission region TA. In such an embodiment, the optical layer CF may include a bezel layer NBM disposed on the bezel region BZA.

In an embodiment, the partition wall layer WA, the reflection layer CC, and the light-blocking layer ABM may collectively define an optical filter layer.

The partition wall layer WA of the optical filter layer may be disposed on the window layer WM. In one embodiment, for example, the partition wall layer WA may be disposed on a rear surface of the window layer WM (i.e., a surface facing the display panel DP or DP-1). The partition wall layer WA may be disposed on the rear surface of the window layer WM to prevent the display panel DP or DP-1 from being shown through the window layer WM by an external incident light. The partition wall layer WA may include a light-blocking organic material. The partition wall layer WA may have a predetermined color. In one embodiment, for example, the partition wall layer WA may have a blue color.

The partition wall layer WA including a plurality of openings OP. for example, the plurality of openings OP may be defined in the partition wall layer WA. At least a portion of the window layer WM may be exposed through the openings OP of the partition wall layer WA. The openings OP may overlap a corresponding light-emitting region of the display panel DP. In one embodiment, for example, the openings OP may overlap the light-emitting pattern EP of the organic light emitting device OLED of FIG. 3. In an alternative embodiment, the openings OP may overlap the first or pixel electrode PE of the liquid crystal display device LC of FIG. 4. The light-emitting regions in each of FIGS. 3 and 4 are depicted by dotted lines.

The reflection layer CC of the optical filter layer may be disposed on the rear surface of the window layer WM. The reflection layer CC, along with the partition wall layer WA, may prevent the display panel DP or DP-1 from being shown through the window layer WM by an external incident light.

The reflection layer CC may include first to third reflection patterns CC1, CC2, and CC3. Each of the first to third reflection patterns CC1, CC2, and CC3 may be disposed in a corresponding one of the openings OP. Each of the first to third reflection patterns CC1, CC2, and CC3 may overlap the light-emitting region of the display panel DP or DP-1.

The first to third reflection patterns CC1, CC2, and CC3 may block or transmit lights of different colors. In one embodiment, for example, the first reflection pattern CC1 may transmit only blue light, the second reflection pattern CC2 may transmit only red light while blocking the blue light, and the third reflection pattern CC3 may transmit only green light while blocking the blue light.

Each of the first to third reflection patterns CC1, CC2, and CC3 may include a light-blocking organic material. The first to third reflection patterns CC1, CC2, and CC3 may have different colors from each other. In one embodiment, for example, the first reflection pattern CC1 may have a blue color, the second reflection pattern CC2 may have a red color, and the third reflection pattern CC3 may have a green color.

In an embodiment, the first reflection pattern CC1 and the partition wall layer WA may be formed by a same process or simultaneously during a same process. Thus, in such an embodiment, the first reflection pattern CC1 may include a same material as the partition wall layer WA and may have a same color as the partition wall layer WA. The first reflection pattern CC1 may be a pattern that is formed by the same process as that for the partition wall layer WA. In FIG. 5, for convenience in description, by using dotted lines, the first reflection pattern CC1 and the partition wall layer WA are illustrated as being separate elements, but the first reflection pattern CC1 may be defined by a part of the partition wall layer WA.

When viewed in a sectional view, the partition wall layer WA may have widths different from each other. In one embodiment, for example, the first reflection pattern CC1 may be defined by a portion of the partition wall layer WA, and thus, a width, in a specific direction, of the partition wall layer WA provided with the first reflection pattern CC1 may be greater than a width of the partition wall layer disposed between the second and third reflection patterns CC2 and CC3.

In an embodiment, the first reflection pattern CC1 may have a planar shape different from those of the second reflection pattern CC2 and the third reflection pattern CC3. In one embodiment, for example, a top surface of the first reflection pattern CC1 may be coplanar with a top surface of the partition wall layer WA. In such an embodiment, the second reflection pattern CC2 and the third reflection pattern CC3 may cover at least a portion of the partition wall layer WA and the light-blocking layer ABM. In such an embodiment, the second reflection pattern CC2 and the third reflection pattern CC3 adjacent thereto may have side surfaces that are in contact with each other.

The light-blocking layer ABM of the optical filter layer may be disposed on the partition wall layer WA. The partition wall layer WA may not overlap the light-emitting region of the display panel DP or DP-1. The light-blocking layer ABM may be disposed between the light-emitting regions to absorb light that may be leaked to a neighboring light-emitting region. In such an embodiment, the light-blocking layer ABM may include an optically opaque material. In one embodiment, for example, the light-blocking layer ABM may include at least one of metallic particles whose metallic element includes at least one of chromium (Cr), silver (Ag), molybdenum (Mo), nickel (Ni), titanium (Ti), or tantalum (Ta), oxides of the metallic particles, or organic materials.

The light-blocking layer ABM may be disposed between the light-emitting regions of the display panel DP or DP-1 to prevent a color-mixing issue from occurring between different light-emitting regions such that the display apparatus EA with improved color reproduction characteristics may be realized.

The color filter layer CP may improve color reproduction characteristics of lights provided from the display panel DP or DP-1. The color filter layer CP may include first to third color patterns CP1, CP2, and CP3. Each of the first to third color patterns CP1, CP2, and CP3 may overlap a corresponding one of the first to third reflection patterns CC1, CC2, and CC3. In one embodiment, for example, the first color pattern CP1 may be disposed on the first reflection pattern CC1. The second color pattern CP2 may be disposed on the second reflection pattern CC2, and the third color pattern CP3 may be disposed on the third reflection pattern CC3.

In an embodiment, the first color pattern CP1 may display a same color as that of light provided from the display panel DP or DP-1. In one embodiment, for example, the blue light generated by the display panel DP or DP-1 may pass through the first color pattern CP1 as it is. The first color pattern CP1, which corresponds to a region that emits the blue light, may include a material, in which fluorescent bodies or quantum dots are not included, and which transmit the blue light incident thereto. The first color pattern CP1 may further include an element causing scattering of an incident light. In one embodiment, for example, the first color pattern CP1 may include at least one of titanium oxide ($TiO_2$), polymer (e.g., photo-sensitive resin), blue dye, or blue pigment, but the invention is not limited thereto. In one embodiment, for example, any material that does not cause a change in color of the blue light may be used for the first color pattern CP1.

Each of the second color pattern CP2 and the third color pattern CP3 may include a plurality of quantum dots for converting light. The quantum dot may be nanocrystal including at least one material selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle. In certain embodiments, each of the quantum dots may have a core/shell structure, in which one quantum dot is enclosed by another quantum dot. At an interface between the core and the shell, an element contained in the shell may have a concentration gradient decreasing in a central direction.

In an embodiment, the quantum dot may have a core-shell structure, which includes a core containing the afore-described nanocrystal and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. In one embodiment, for example, the shell of the quantum dot may be formed of or include oxide compounds of metallic or nonmetallic elements, semiconductor compounds, or any combination thereof.

In one embodiment, for example, the oxide compounds of metallic or nonmetallic elements for the shell may include binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO) and ternary compounds (e.g., $MgAl_2O_4$, $CoFe_2O_4$, $NiFe_2O_4$, and $CoMn_2O_4$), but the invention is not limited to these examples.

In an embodiment, the semiconductor compounds for the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the invention is not limited to these examples.

Each of the quantum dots may have a light-emitting wavelength spectrum whose FWHM is less than about 45 nm (e.g., less than about 40 nm or less than about 30 nm), and in such an embodiment, it improved color purity or color reproduction characteristics may be realized. In an embodiment, the quantum dots may allow light to be emitted radially, and thus, a viewing angle property may be improved.

In an embodiment, the quantum dots may be a spherical, pyramid-shaped, multi-arm, or cubic nano particle. In an alternative embodiment, the quantum dots may be a nano tube, a nano wire, a nano fiber, a nano plate-shaped particle, but the invention is not limited to these examples.

A wavelength or color of light emitted from the quantum dot may be determined by a particle size of the quantum dot, and by providing quantum dots of various sizes, it may be possible to realize various colors (e.g., blue, red, and green).

The bezel layer NBM may be disposed on the rear surface of the window layer WM. The bezel layer NBM may be disposed on the bezel region BZA of the rear surface of the window layer WM. The bezel layer NBM may be disposed on the bezel region BZA to enclose the transmission region TA. In one embodiment, for example, the bezel layer NBM may have a closed loop shape surrounding the transmission region TA. However, the invention is not limited thereto or a specific embodiment, and in an alternative embodiment, the shape of the bezel layer NBM may be variously modified or changed depending on the shape of the bezel region BZA defined in the window layer WM.

The bezel layer NBM may include an optically opaque material. The bezel layer NBM may absorb light, which is emitted from the pixel PX1 or PX2 of the display panel DP or DP-1 and is leaked to the bezel region BZA through the peripheral region NAA. Thus, a light leakage issue, in which the leaked light is recognized by a user through the bezel region BZA of the window layer WM, may be effectively prevented, thereby providing a display apparatus with improved reliability.

In an embodiment, the bezel layer NBM may be formed by a same process as that for the light-blocking layer ABM. Thus, the bezel layer NBM and the light-blocking layer ABM may include a same material as each other and may have as same color as each other. In an embodiment, the bezel layer NBM and the light-blocking layer ABM may have a same thickness as each other in a thickness direction of the cover panel CU.

The bezel layer NBM may include a bottom portion NBM-B facing the rear surface of the window layer WM, an upper portion NBM-U opposite to the bottom portion NBM-B, and a side portion NBM-S connecting the bottom portion NBM-B to the upper portion NBM-U. In an embodiment, the side portion NBM-S may be inclined at an oblique angle relative to the bottom portion NBM-B. In one embodiment, for example, when viewed in a sectional view, the bezel layer NBM may have a tapered shape. However, the invention is not limited thereto or a specific embodiment, and in an alternative embodiment, the side portion NBM-S may be vertically extended from the bottom portion NBM-B and may be connected to the upper portion NBM-U.

According to an embodiment of the invention, since the light-blocking layer ABM of the transmission region TA and the bezel layer NBM of the bezel region BZA are formed by a same process, it process cost and process time may be reduced.

In an embodiment, the cover panel CU may further include a cover inorganic layer CIOL. The cover inorganic layer CIOL may be disposed on the entire surface of the window layer WM. The cover inorganic layer CIOL may cover the color filter layer CP and may effectively prevent oxygen and moisture from entering the color filter layer CP. The cover inorganic layer CIOL may be formed of or include at least one of silicon oxide ($SiO_x$) or silicon nitride ($SiN_x$).

Figure 6:
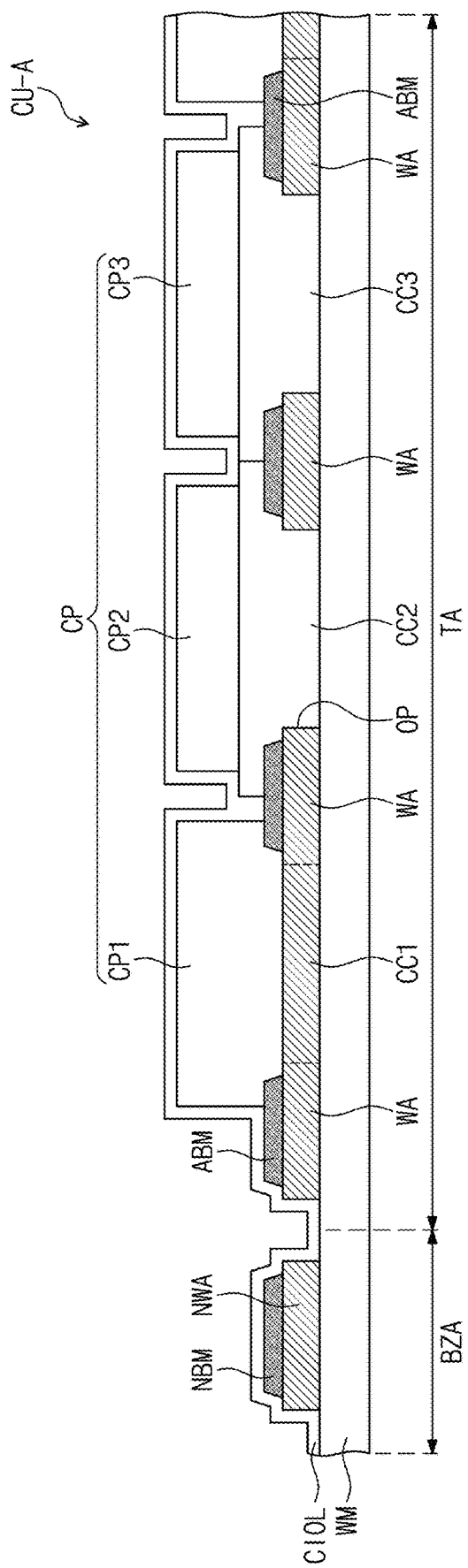
FIG. 6 is a sectional view illustrating a cover panel according to an alternative embodiment of the invention.
Figure 7:
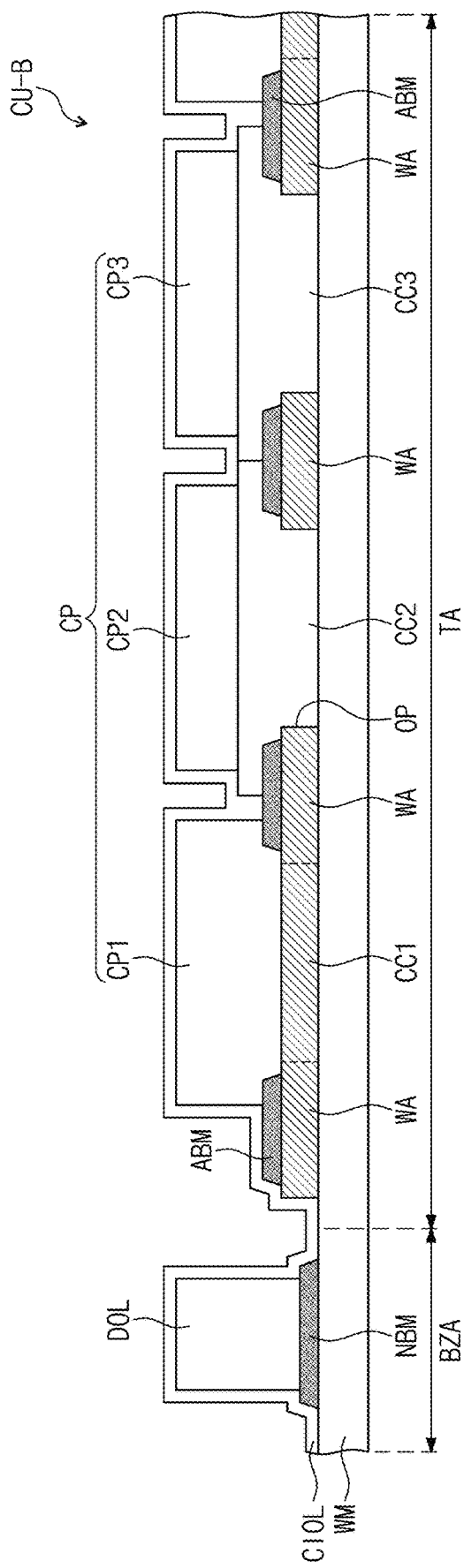
FIG. 7 is a sectional view illustrating a cover panel according to another alternative embodiment of the invention.
Figure 8:
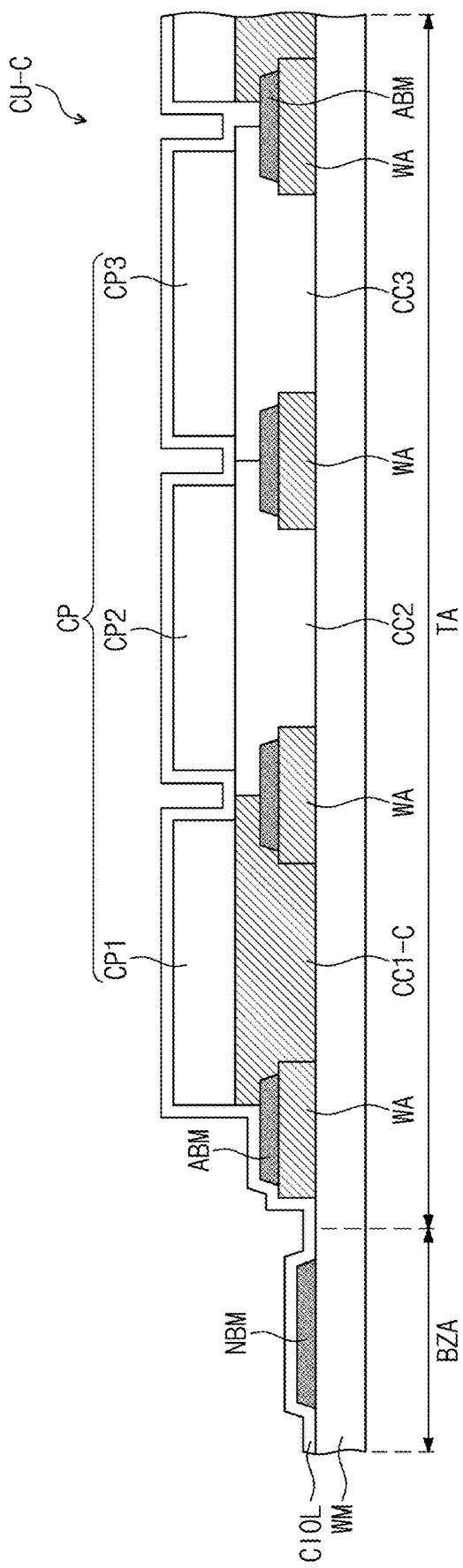
FIG. 8 is a sectional view illustrating a cover panel according to another alternative embodiment of the invention.

FIG. 6 is a sectional view illustrating a cover panel according to an alternative embodiment of the invention. FIG. 7 is a sectional view illustrating a cover panel according to another alternative embodiment of the invention. FIG. 8 is a sectional view illustrating a cover panel according to another alternative embodiment of the invention. For concise description, a like or same element as that previously described with reference to FIGS. 1 to 5 may be identified by a same reference number, and any repetitive detailed description thereof will be omitted.

Referring to FIG. 6, an embodiment of a cover panel CU-A may further include an additional light-blocking layer NWA. The additional light-blocking layer NWA may be disposed on the rear surface of the window layer WM. The additional light-blocking layer NWA may be disposed on the bezel region BZA, which is a portion of the rear surface of the window layer WM.

In an embodiment, the bezel layer NBM may be disposed on the additional light-blocking layer NWA. The additional light-blocking layer NWA may be formed by a same process as that for the partition wall layer WA. Thus, the additional light-blocking layer NWA may include a same material as the partition wall layer WA and may have a same color as the partition wall layer WA. In one embodiment, for example, both of the additional light-blocking layer NWA and the partition wall layer WA may have a blue color.

Referring to FIG. 7, an embodiment of a cover panel CU-B may further include a height-difference compensation layer DOL. The height-difference compensation layer DOL may be disposed on the rear surface of the window layer WM. The height-difference compensation layer DOL may be disposed on the bezel region BZA of the rear surface of the window layer WM.

In an embodiment, the height-difference compensation layer DOL may be disposed on the bezel layer NBM. The height-difference compensation layer DOL may include an organic material.

The height-difference compensation layer DOL may compensate a difference in height between elements of the cover panel CU-B disposed on the transmission region TA, and thus, the cover panel CU-B may have an improved impact-resistant property.

Referring to FIG. 8, in an alternative embodiment, a first reflection pattern CC1-C of a cover panel CU-C may cover the partition wall layer WA and at least a side portion of the light-blocking layer ABM, unlike the first reflection pattern CC1 of FIG. 6. In such an embodiment, a portion of the first reflection pattern CC1-C may be in contact with a side portion of the second reflection pattern CC2. In such an embodiment, the first to third reflection patterns CC1-C, CC2, and CC3 may have top surfaces that are substantially coplanar with each other.

FIGS. 9A to 9G are sectional views illustrating a method of fabricating a display apparatus, according to an embodiment of the invention. For concise description, a same or like element as that previously described with reference to FIGS. 1 to 5 may be identified by a same reference number, and any repetitive detailed description thereof will be omitted. Hereinafter, a method of fabricating a display apparatus according to an embodiment of the invention will be described with reference to FIGS. 9A to 9G.

Referring to FIG. 9A, the fabrication method may include providing or forming a preliminary partition wall layer CC1-A. The preliminary partition wall layer CC1-A may be provided, e.g., coated, on the rear surface of the window layer WM. The preliminary partition wall layer CC1-A may include a light-blocking organic material. The preliminary partition wall layer CC1-A may have a predetermined color. In one embodiment, for example, the preliminary partition wall layer CC1-A may have a blue color.

Thereafter, as shown in FIG. 9B, the partition wall layer WA may be formed using the preliminary partition wall layer CC1-A. The formation of the partition wall layer WA may include patterning the preliminary partition wall layer CC1-A through a photolithography process using a first mask MS1. The patterning may be performed to form the opening OP in the partition wall layer WA. The opening OP may be formed to expose at least a portion of the rear surface of the window layer WM.

Thereafter, as shown in FIGS. 9C and 9D, a first material and a second material may be coated on the window layer WM. The first material may be an organic material, which is coated on the transmission region TA of the window layer WM, and the second material may be an organic material, which is coated on the bezel region BZA of the window layer WM. The first material may be coated on the transmission region TA of the window layer WM to cover the partition wall layer WA.

Next, the first material may be patterned to form the light-blocking layer ABM. The light-blocking layer ABM may be formed on the partition wall layer WA to overlap the transmission region TA.

In such an embodiment, the second material may be patterned to form the bezel layer NBM. The bezel layer NBM may be formed on the rear surface of the window layer WM to overlap the bezel region BZA.

According to an embodiment of the invention, the first and second materials may be substantially the same as each other. The first and second materials may define a preliminary light-blocking layer BMA, and the preliminary light-blocking layer BMA may include a light-absorbing organic material. Thus, the light-blocking layer ABM and the bezel layer NBM may be formed of a same material as each other or as a material of the preliminary light-blocking layer BMA. The light-blocking layer ABM and the bezel layer NBM may be formed by patterning the preliminary light-blocking layer BMA through a photolithography process using a second mask MS2.

In an embodiment, the light-blocking layer ABM and the bezel layer NBM may be simultaneously patterned by a same process, and thus, cost and time in the fabrication process may be reduced. Thus, in such an embodiment, process efficiency in a process of fabricating a display apparatus may be improved.

Next, the reflection patterns CC2 and CC3 may be provided or formed, as shown in FIG. 9E. Each of the reflection patterns CC2 and CC3 may be formed to overlap a corresponding one of the openings OP, which are defined in the partition wall layer WA. Each of the reflection patterns CC2 and CC3 may be formed by coating a light-blocking organic material and then performing a photolithography process. The reflection patterns CC2 and CC3 may be formed of organic materials of different colors, respectively. In an embodiment, the first reflection pattern CC1 may be formed by patterning the preliminary partition wall layer CC1-A (i.e., by the same process as that for forming the partition wall layer WA), and thus, the first reflection pattern CC1 and the partition wall layer WA may be connected to each other to constitute a single body. However, for convenience in description, the first reflection pattern CC1 and the partition wall layer WA are depicted as two separate elements.

Thereafter, the optical filter layer may be provided on the first to third reflection patterns CC1, CC2, and CC3, as shown in FIG. 9F. The color filter layer CP may include the first to third color patterns CP1, CP2, and CP3 that emit lights of different colors from each other. The first to third color patterns CP1, CP2, and CP3 may be respectively formed on corresponding ones of the first to third reflection patterns CC1, CC2, and CC3. The first to third color patterns CP1, CP2, and CP3 may include different quantum dots for emitting lights of different colors.

Figure 9G:
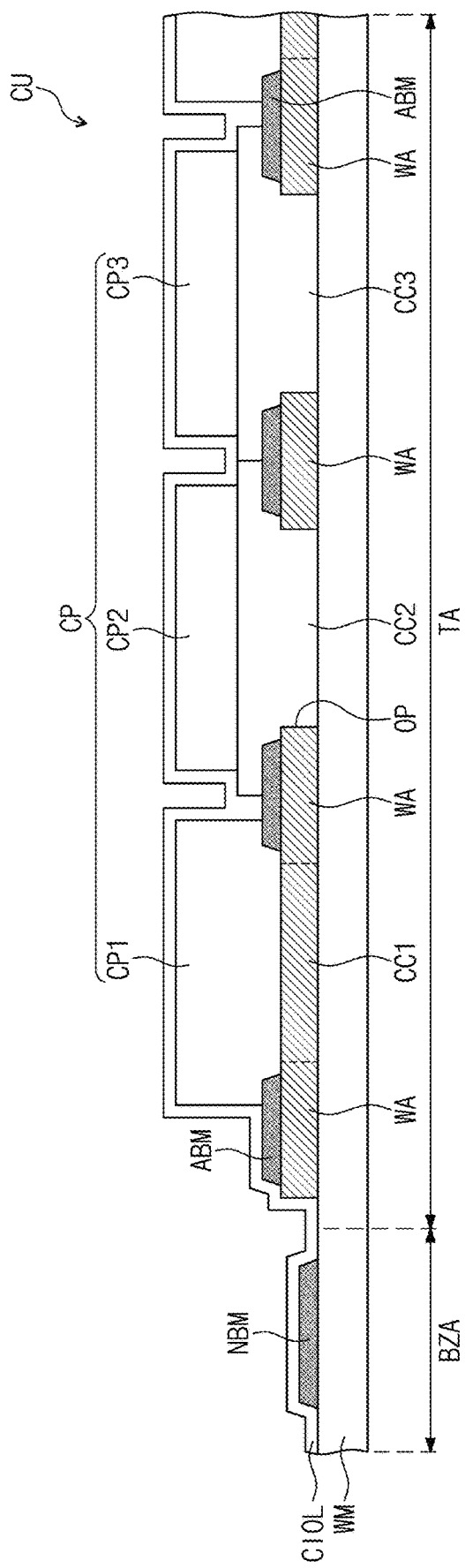

Next, the cover inorganic layer CIOL may be provided or formed, as shown in FIG. 9G. The cover inorganic layer CIOL may be formed on the rear surface of the window layer WM. The cover inorganic layer CIOL may cover the color filter layer CP. The first to third color patterns CP1, CP2, and CP3 may be divided by the cover inorganic layer CIOL. The cover inorganic layer CIOL may effectively prevent moisture and oxygen from entering the color filter layer CP.

According to an embodiment of the invention, a bezel layer, in which a light-blocking material is included, may be provided in a bezel region of a window layer, such that a light leakage issue, in which light leaked from a pixel is recognized by a user through a bezel region, is effectively prevented. Thus, in such an embodiment, a display apparatus has improved reliability.

In an embodiment, the bezel layer and the light-blocking layer may be provided or formed by a same process, such that process efficiency in a process of fabricating a display apparatus may be improved.

While the invention have been described with reference to exemplary embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display apparatus, comprising:
   a window layer, in which a transmission region and a bezel region adjacent to the transmission region are defined;
   a partition wall layer disposed on the transmission region of the window layer, wherein a plurality of openings is defined though the partition wall layer;
   a light-blocking layer disposed on the partition wall layer;
   a reflection layer comprising first to third reflection patterns disposed in the openings;
   a color filter layer disposed on the reflection layer, wherein the color filter layer comprises a quantum dot; and
   a bezel layer disposed on the bezel region,
   wherein the bezel layer comprises a same material as the light-blocking layer.

2. The display apparatus of claim 1, wherein the bezel layer has a same color as the light-blocking layer.

3. The display apparatus of claim 1, wherein the bezel layer has a closed loop shape surrounding the transmission region.

4. The display apparatus of claim 1, wherein one of the first to third reflection patterns comprises a same material as the partition wall layer.

5. The display apparatus of claim 1, wherein
the color filter layer comprises first to third color patterns overlapping the first to third reflection patterns, respectively, and
one of the first to the third color patterns transmits light provided from the pixels.

* * * * *